United States Patent [19]

Yoshida et al.

[11] Patent Number: 4,910,744
[45] Date of Patent: Mar. 20, 1990

[54] BURIED HETEROSTRUCTURE SEMICONDUCTOR LASER DEVICE

[75] Inventors: Toshihiko Yoshida, Tenri; Haruhisa Takiguchi; Shinji Kaneiwa, both of Nara; Hiroaki Kudo, Tenri, all of Japan

[73] Assignee: Sharp Kabushiki Kaisha, Osaka, Japan

[21] Appl. No.: 130,352

[22] Filed: Dec. 8, 1987

[30] Foreign Application Priority Data

Dec. 9, 1986 [JP] Japan .................................. 61-293667

[51] Int. Cl.⁴ .............................................. H01S 3/19
[52] U.S. Cl. ......................................... 372/46; 372/45
[58] Field of Search ........................ 372/43, 44, 45, 46

[56] References Cited

U.S. PATENT DOCUMENTS

| | | | |
|---|---|---|---|
| 4,525,841 | 6/1985 | Kitamura et al. | 372/46 |
| 4,573,161 | 2/1986 | Sakai et al. | 372/45 |
| 4,597,085 | 6/1986 | Mito et al. | 372/46 |
| 4,661,961 | 4/1987 | Nelson et al. | 372/46 |
| 4,730,329 | 3/1988 | Yoshida et al. | 372/44 |
| 4,745,612 | 5/1988 | Hayakawa et al. | 372/45 |
| 4,839,900 | 6/1989 | Yoshida et al. | 372/46 |

FOREIGN PATENT DOCUMENTS

| | | |
|---|---|---|
| 0125738 | 11/1984 | European Pat. Off. . |
| 0206496 | 12/1986 | European Pat. Off. . |
| 0210616 | 12/1986 | European Pat. Off. . |
| 0215298 | 5/1987 | European Pat. Off. . |
| 0177989 | 8/1987 | Japan .................................. 372/46 |
| 0204587 | 9/1987 | Japan .................................. 372/46 |

OTHER PUBLICATIONS

Smith, Xerox Disclosure Journal, 11(4):151–152; "A Method for Fabricating an Index Guided Laser".
Hayakawa et al. (1986), Applied Physics Letters, 49(11):636–638; "Low Current Threshold AlGaAs Visible Laser Diodes with an $(AlGaAs)_n (GaAs)_m$ Supper Lattice Quantum Well".

Primary Examiner—William L. Sikes
Assistant Examiner—B. R. R. Holloway
Attorney, Agent, or Firm—Irell & Manella

[57] ABSTRACT

A semiconductor laser device comprising a semiconductor substrate, an active layer having a refractive index greater than that of said substrate and having an energy gap smaller than that of said substrate, and a cladding layer having a conductivity type different from that of said substrate, in that order, resulting in a double-heterostructure, wherein two parallel grooves with a given distance therebetween are disposed in the double-heterostructure so as to reach said substrate and a first burying layer having the same conductivity type as said substrate, a second burying layer having a conductivity type different from that of said substrate and a third burying layer having the same conductivity type as said substrate are disposed outside of the two grooves in that order, and moreover a semiconductor layer with the flat surface having a conductivity type different from that of said substrate is disposed over the third burying layer and the area positioned between the two parallel grooves.

3 Claims, 2 Drawing Sheets

BURIED HETEROSTRUCTURE SEMICONDUCTOR LASER DEVICE

BACKGROUND OF THE INVENTION

1. Field of the invention:

This invention relates to a buried type semiconductor laser device, which effectively suppresses ineffective current that is useless for laser oscillation even when current injected into the device is increased.

2. Description of the prior art:

Buried type semiconductor laser devices, in which an active layer for laser oscillation is surrounded by semiconductor layers having a refractive index smaller than that of the active layer and an energy gap larger than that of the active layer, are advantageous in that laser oscillation can be attained in a stable transverse mode at a low threshold current level, and accordingly they have been used as light sources for optical communication systems and/or optical measuring systems using optical fibers. For these reasons, they are industrially important devices. However, with such buried type semiconductor laser devices, ineffective current not passing through the active layer greatly increases with an increase in current injected into the laser devices, which causes limitations on the maximum value of the output power of the laser devices. Moreover, the ineffective current increases with a rise in temperature, which causes limitations on the temperature ranges in which the laser devices are used and which causes difficulties in the practical application of these buried type semiconductor laser devices, especially InGaAsP/Inp semiconductor laser devices having a light-emitting wavelength in the range of 1.1 to 1.6 $\mu$m at which optical fibers undergo little optical loss.

The reason why the above-mentioned ineffective current arises seems to be as follows: Buried type semiconductor laser devices are, for example, provided with the structures shown in FIG. 3(A) and 3(B). The laser device shown in FIG. 3(A) is produced as follows: On a n-InP substrate 1, and n-InP buffer layer 2, a non-doped InGaAs active layer 3, and a p-InP cladding layer 4 are successively grown by an epitaxial growth technique. The resulting multi-layered epitaxial growth crystal is subjected to a chemical etching treatment to form a mesa. Then, on both sides of the mesa, a p-InP burying layer 5 and an n-InP burying layer 6 are grown. The laser device shown in FIG. 3(B) is produced as follows: On an n-InP substrate 1, a p-InP burying layer 5 and an n-InP burying layer 6 are successively grown by an epitaxial growth technique. The resulting epitaxial growth crystal is subjected to a chemical etching treatment to form a channel. Then, an InP buffer layer 2, an InGaAsP active layer 3, and a p-InP cladding layer 4 are successively grown in the channel by an epitaxial growth technique.

The laser device produced according to the production mode shown in each of FIGS. 3(A) and 3(B) attains laser oscillation depending upon the injected current 7 passing through the active layer 3. Since the p-n junction at the interface between the burying layers 5 and 6 positioned at the sides of the active layer 3 is reversely biased, little current passes through the burying layers 5 and 6 when the injected current is small. However, a considerable amount of current passes through the burying layers 5 and 6 positioned at the sides of the active layer 3 as the injected current 7 increases. This is because a thyristor composed of the cladding layer 4, the burying layer 6, the burying layer 5 and the buffer layer 2 (or the substrate 1) is made conductive by a gate current 7b which flows from the cladding layer 4 to the burying layer 5 (Higuchi et al: Laser Kenkyu vol. 13, p. 156, 1985). If the active layer 3 is formed at the interface between the lower burying layer 5 and the upper burying layer 6, the injected current (i.e., the gate current) 7b will be reduced. However, such precise control of the thickness of layers cannot be made using liquid phase epitaxy and chemical etching techniques at present. Thus, the ineffective current mentioned above cannot be prevented.

In order to prevent the above-mentioned ineffective current, a laser device with the structure shown in FIG. 2 has been proposed in which on a substrate 1, a first burying layer 8 having the same conductivity type as the substrate, a second burying layer 5 having a conductivity type different from that of the substrate and a third burying layer 6 having the same conductivity type as the substrate 1 are successively grown by an epitaxial growth technique to thereby cut off the gate current 7b. This structure is designed utilizing knowledge from the Mitro report (Mito et al: Denshi Tsushin Gakkai Gijutsu Report OQE 80-116) disclosing that when the width of a mesa is as narrow as 4 $\mu$m or less, the growth of burying layers on the mesa is prevented. However, with the above-mentioned structure, the growth rate of the portions of the burying layers at the sides of the mesa is higher than that of the portions thereof that are far away from the mesa, and in order to prevent the growth of the burying layers on the mesa, the time of the growth period must be shortened. As a result, the thickness of the portion of each of the three burying layers 5, 6 and 8, which is far away from the mesa, becomes thinner than that of the portion of each of these burying layers that is near the mesa, which causes difficulties in the achievement of the current-blocking characteristics of a thyristor composed of the substrate 1, the buffer layer 2 or the first burying layer 8, the second burying layer 5, the third burying layer 6 and the cladding layer 4'.

SUMMARY OF THE INVENTION

The semiconductor laser device of this invention, which overcomes the above-discussed and numerous other disadvantages and deficiencies of the prior art, comprises a semiconductor substrate, an active layer having a refractive index greater than that of said substrate and having an energy gap smaller than that of said substrate, and a cladding layer having a conductivity type different from that of said substrate, in that order, resulting in a double-heterostructure, wherein two parallel grooves with a given distance therebetween are disposed in the double-heterostructure so as to reach said substrate and a first burying layer having the same conductivity type as said substrate, a second burying layer having a conductivity type different from that of said substrate and a third burying layer having the same conductivity type as said substrate are disposed outside of the two grooves in that order, and moreover a semiconductor layer with a flat surface having a conductivity type different from that of said substrate is disposed over the third burying layer and the area positioned between the two parallel grooves. The multi-layered structure disposed over each of the two parallel grooves constitutes a thyristor structure.

In a preferred embodiment, the two parallel grooves are disposed with a distace of 4 μm or less therebetween.

Thus, the invention described herein makes possible the objectives of (1) providing a semiconductor laser device in which the flow of current into burying layers positioned at the sides of an active layer is suppressed so that ineffective current is minimal even though current injected into the laser device is increased; (2) providing a semiconductor laser device that attains excellent current-blocking characteristics in the portion that is far away from the mesa; (3) providing a semiconductor laser device in which high output power operation can be achieved without an increase in ineffective current regardless of an increase in current injected into the laser device, so that the laser device is suitable for a signal light source; and (4) providing a semiconductor laser device in which, since ineffective current not passing through the active layer is minimal, heat generation of the laser device due to the ineffective current is prevented and the laser device operates even at a significantly high temperature.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
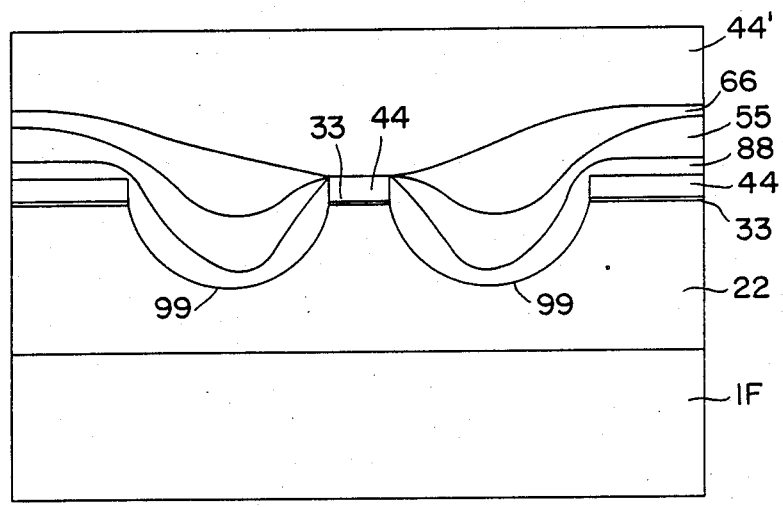
FIG. 1 is a sectional front view showing a semiconductor laser device of this invention.
Figure 2:
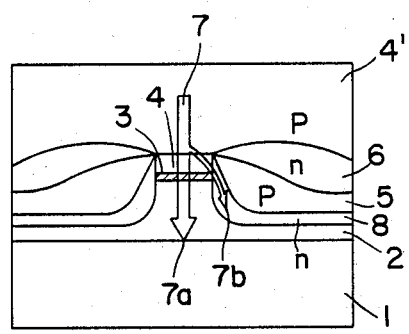
FIGS. 2, 3(A) and 3(B), respectively, are sectional front views showing conventional buried type semiconductor laser devices.

FIG. 1 shows a semiconductor laser device of this invention, which is produced as follows:

On the (100) plane of an n-InP substrate 11, an n-InP buffer layer 22 having a thickness of 3 μm, a non-doped InGaAsP active layer 33 having a light-emitting wavelength of 1.3 μm and a thickness of 0.1 μm, and a p-InP cladding layer 44 having thickness of 0.5 μm are successively grown by liquid phase epitaxy. The resulting multi-layered epitaxial growth crystal is subjected to an etching treatment with a Br-methanol solution as an etchant to form two parallel grooves 99 (the distance therebetween being 2 μm and the width thereof being 7 μm each) reaching the buffer layer 22 in the <011> direction by the use of a striped pattern, as a mask, corresponding to the said parallel grooves.

The above-mentioned buffer layer 22 functions to prevent the influence of distortions in the InP substrate 11 on the device characteristics, but it can be omitted.

Figure 3A:
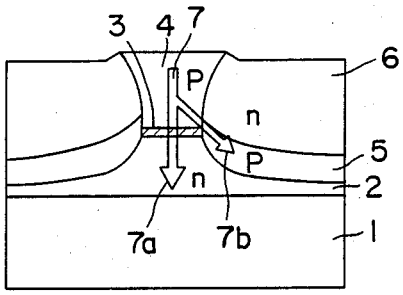
Figure 3B:
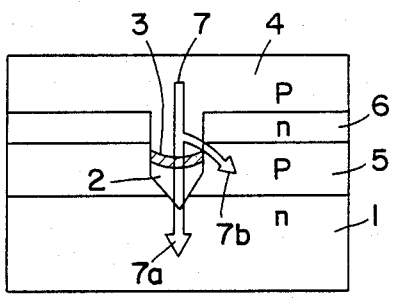
Figure 4A:
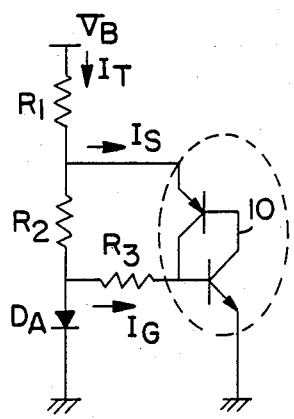
FIG. 4(A) is an electrically equivalent circuit of the conventional buried type semiconductor laser devices shown in FIGS. 3(A) and 3(B).
Figure 4B:
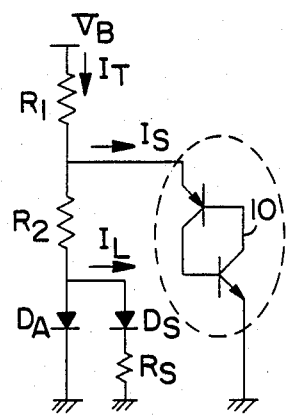
FIG. 4(B) is an electrically equivalent circuit of the semiconductor laser device of this invention shown in FIG. 1.

Then, on the wafer, a first n-InP burying layer 88 having the same conductivity type as the buffer layer 22 (or the substrate 11) (the thickness of the flat portion of the first burying layer 88 being 0.5 μm), a second p-InP burying layer 55 (the thickness of the flat portion thereof being 0.8 μm), a third n-InP burying layer 66 (the thickness of the flat portion thereof being 0.8 μm), and a p-InP cladding layer 44' (the thickness thereof being 3 μm) are successively grown by liquid phase epitaxy. The growth period of time is set, as mentioned above, so that the first, second and third burying layers 88, 55 and 66 are not grown in the area positioned between the above-mentioned parallel grooves. The cladding layer 44' is sufficiently grown so that it is grown on the mesa positioned between the parallel grooves, resulting in a wafer with a flat surface. Then, an n-sided electrode (not shown) is formed on the back face of the substrate 11 and a p-sided electrode (not shown) is formed on the flat surface of the cladding layer 44, followed by cleavage at the (110) plane of the wafer, resulting in a resonator for laser oscillation. The important point of the above-mentioned structure is in that the first burying layer 88 having the same conductivity type as the buffer layer 22 (or the substrate 11) is disposed, so that a gate current 7b such as that discussed in FIGS. 3(A) and 3(B) never flows from the cladding layer 44 into the second burying layer 55. However, with this semiconductor laser device having the above-mentioned structure, ineffective current flows, instead, from the cladding layer 44 to the substrate 11 through the first burying layer 8 without passing through the active layer 33. This fact can be explained in greater detail by FIG. 4, wherein FIG. 4(A) shows an electrically equivalent circuit of the conventional semiconductor laser devices shown in FIGS. 3(A) and 3(B), and FIG. 4(B) shows an electrically equivalent circuit of the semiconductor laser device of this invention shown in FIG. 1. A current-blocking structure can be represented by the equivalent circuit 10 (surrounded by a dashed line) of a thyristor in both semiconductor laser devices shown in FIG. 1 and FIG. 3(A) or 3(B).

With the conventional laser device structure represented by the equivalent circuit shown in FIG. 4(A), the gate current ($I_G$)7b increases with an increase in the injected current ($I_T$)7, and the thyristor becomes conductive. Due to the amplification function of the thyristor, a current ($I_S$) that is very much larger than the gate current ($I_G$) arises. The current ($I_S$) is an ineffective current that does not pass through the active layer 33 represented by a diode $D_A$. Thus, with conventional laser devices represented by the equivalent circuit shown in FIG. 4(A), the ineffective current steeply increases with an increase in the injected current ($I_T$).

On the other hand, with the laser device structure of this invention represented by the equivalent circuit shown in FIG. 4(B), ineffective current that passes through a diode $D_S$ (corresponding to the p-n junction formed by the cladding layer 44 and the first burying layer 88) increases with an increase in the injected current ($I_T$). However, the amount of ineffective current is only proportional to the amount of injected current, and the thyristor is maintained to be non-conductive. Thus, the increase in the ineffective current in the laser device structure of this invention shown in FIG. 1 is very much smaller than that of the ineffective current in the conventional laser device structures shown in FIGS. 3(A) and 3(B), thereby allowing high output power operation.

In the above-mentioned example, the thyristor corresponds to the current-blocking structure of the grooves, and moreover the portion outside of the grooves constitutes a p-n-p-n-p-n multi-layered structure, so that the laser device of this example can attain excellent current-blocking characteristics. The laser device of this invention produces little ineffective current so that oscillating operation at a high output power of 70 mW or more at room temperatures can be achieved. Moreover, the effect on heat generation due to ineffective current is so small that laser oscillation can be attained even at a temperature of as high as 140° C. or more.

Although the above-mentioned example discusses only a laser device in which an n-substrate is used for the epitaxial growth substrate, a laser device using a p-substrate therein as the growth substrate can attain the same effect as mentioned above. An InGaAsP crystal having a light-emitting wavelength of 1.3 μm is used for the active layer of the laser device of this example, but this invention is not limited thereto. Any InGaAs crystal (having a light-emitting wavelength in the range of 1.1 to 1.6 μm), the lattice constant of which matches that of InP crystals, can be used for the active layer. Although InP is only used in this example for the first, second and third burying layers, these burying layers can be made of InGaAsP or the like having a refractive index smaller than that of the active layer and having an energy gap larger than that of the active layer. Although the above-mentioned example discloses only the InGaAsP/InP semiconductor laser device, it is, of course, applicable to other III–V group compound semiconductor laser devices.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser device comprising a semiconductor substrate with a first conductivity type, an active layer above said substrate, and a cladding layer with a second conductivity type, in that order, resulting in a double-heterostructure, wherein two parallel grooves with a given distance therebetween are formed through portions of said cladding layer and said active layer toward said substrate, and a first burying layer with the first conductivity type, a second burying layer with the second conductivity type and a third burying layer with the first conductivity type are disposed, in that order, within and outside of said two grooves except for an entire area positioned between said two grooves, and moreover a semiconductor layer with a flat surface having the second conductivity type is disposed over said third burying layer and the entire area positioned between said two parallel grooves, and a laminated structure formed in each of the lateral outsides of said two grooves, said laminated structure comprising said semiconductor layer with the second conductivity type, said third burying layer with the first conductivity type, said second burying layer with the second conductivity type, said first burying layer with the first conductivity type, said cladding layer with the second conductivity type, and said substrate with the first conductivity type.

2. A semiconductor laser device according to claim 1, wherein a multi-layered structure which comprises said substrate, said first, second and third burying layers, and said semiconductor layer with the flat surface, and which is disposed within and over each of the two parallel grooves, constitutes a thyristor structure.

3. A semiconductor laser device according to claim 1, wherein the two parallel grooves are disposed with a distance of 4 μm or less therebetween.

* * * * *